United States Patent [19]
Schoenberg

[11] Patent Number: 5,089,427
[45] Date of Patent: Feb. 18, 1992

[54] SEMICONDUCTOR DEVICE AND METHOD

[75] Inventor: Mark Schoenberg, Chandler, Ariz.

[73] Assignee: Motorola Inc., Schaumburg, Ill.

[21] Appl. No.: 620,698

[22] Filed: Dec. 3, 1990

[51] Int. Cl.⁵ ............................................. H01L 21/04
[52] U.S. Cl. ..................................... 437/15; 437/150;
437/904; 148/DIG. 174; 357/13
[58] Field of Search ........................ 437/15, 150, 904;
140/DIG. 174; 357/13

[56] References Cited

U.S. PATENT DOCUMENTS

| | | | |
|---|---|---|---|
| 4,213,806 | 7/1980 | Tsang | 437/904 |
| 4,484,206 | 11/1984 | Moroshima et al. | 357/13 |
| 4,742,021 | 5/1988 | Burnham | 437/904 |
| 4,775,643 | 10/1988 | Wetteruth | 437/904 |
| 4,797,371 | 1/1989 | Kuroda | 357/13 |
| 4,835,111 | 5/1989 | Wright et al. | 437/904 |
| 4,886,762 | 12/1989 | Boland et al. | 437/15 |
| 4,977,107 | 12/1990 | Moran | 437/15 |

FOREIGN PATENT DOCUMENTS

| | | | |
|---|---|---|---|
| 0087312 | 8/1983 | European Pat. Off. | 437/904 |
| 59-79578 | 5/1984 | Japan | 437/904 |
| 62-120085 | 6/1987 | Japan | 437/904 |

*Primary Examiner*—Brian E. Hearn
*Assistant Examiner*—Kevin M. Picardat
*Attorney, Agent, or Firm*—Joe E. Barbee; Robert M. Handy

[57] ABSTRACT

The manufacturing yield and properties of Zener diodes and other PN junctions are improved by locating the main PN junction remote from the die surface and providing at least two shallower concentric P regions of lighter doping surrounding the main P region. A first shallow P region contacts the main P region and a second extends to the die edge and is separated from the first region by an annular N region. Metallization contacting the main P region extends over the first shallow P region but not over the annular N region. Contact to the N substrate is conveniently made on the rear surface of the die.

12 Claims, 2 Drawing Sheets

SEMICONDUCTOR DEVICE AND METHOD

FIELD OF THE INVENTION

This invention concerns improved means and methods for forming a semiconductor junction, and more particularly, a semiconductor junction protected from adverse affects of manufacturing defects.

BACKGROUND OF THE INVENTION

Semiconductor devices, for example Zener diodes, are well known in the art. However, for a number of reasons, the manufacturing yield and reliability of semiconductor devices is less than optimal. For example, the existence of defects in the masks and masking layers used to fabricate the various doped regions making up the device can produce unwanted holes or weak spots in the protective surface dielectric or mask and lead to low resistance shunts across the PN junction when the holes or weak spots are filled or decorated with metal during contact metallization. This leads to a higher than desired incidence of shorts or premature breakdown and, therefore, lower than expected manufacturing yield.

Another problem is the existence of edge defects which can alter the electronic properties of the semiconductor substrate in which the devices are fabricated. Semiconductor devices are fabricated in wafer form and the wafers are then cut into many individual die by scribing or sawing or a combination thereof. Scribing for example, may be by a scribing tool or by a laser. Sawing for example, may be by one or more diamond coated sawing wheels or one or more wire saws which are wet with an abrasive slurry, or a combination thereof. All of these methods produce to varying degrees, crystalline defects in the edge of the die. The electrical effect of such edge defects can extend for a substantial distance into the die and alter the electrical properties of PN junctions or other active regions within the die.

There is an ongoing desire to make device die smaller so that a greater number can be obtained from each wafer. One way of doing this is to reduce the separation between the active regions of the device and the scribe or saw grid at the die periphery. However, as this distance is decreased the adverse influence of edge defects is increased with the result that the manufacturing yield can decline even though there are more die available per wafer. Propagation of such edge cracks into the die as a result of temperature cycling can shorten the useful life of the semiconductor device.

Another problem is created by surface defects, that is, defects in the major surface of the wafer in which the diode, transistor or other semiconductor device is formed. Some of these defects are present in the starting wafer and some are created during wafer processing. If there are surface defects in proximity to critical PN junctions or other active device regions, then device performance and reliability can be adversely affected. Propagation of such surface defects into the die as a result of temperature cycling can shorten the useful life of the semiconductor device.

A number of attempts have been made in the prior art to avoid these and other problems associated with semiconductor devices and semiconductor device manufacture. For example, use of a deep diffused $\pi$-ring to achieve high breakdown voltage diodes is described by Georgescu et al. ("Planar Termination for High-voltage P-N Junctions", *Solid-State Electronics,* Vol., 29, No. 10, 1035-1039, 1986). Ahmad et al ("A Proposed Planar Junction Structure With Near-Ideal Breakdown Characteristics", *IEEE Electron Devices Letters,* Vol. EDL6, No. 9, Pages 465 ff, September 1985), describe the use of a low concentration P-type pocket around the edge region of a P+N type junction to improve the electric field distribution and give near ideal high voltage breakdown characteristics in diodes. Adler et al. ("Breakdown Voltage for Planar Devices with a Single Field Limiting Ring", *PESC 75 Record,* pages 300-313), Brieger et al. ("Blocking Capability of Planar Devices with Field Limiting Rings", *Solid State Electronics,* Vol. 26, No. 8, pages 739-745, 1983), Kao et al. ("High-voltage Planar PN Junctions", *Proceedings of the IEEE,* Vol. 55, No. 8, page 1409 ff, August 1967), and Herman et al. (U.S. Pat. Nos. 4,399, 499 and 4,412,242) describe, among other things, use of one or more P+ rings around a P+N junction to achieve high breakdown voltage. Jaecklin et al. (U.S. Pat. No. 4,305,085) use a combination of P and N+ guards rings around a PN junction to improve the reverse current behavior of the junctions. Ghandi (*"Semiconductor Power Devices",* John Wiley and Sons, NY, page 63 ff, 1977), teaches the use of one or more diffused guard ring structures to control field spreading and achieve high voltage diode breakdown. Temple ("Increased Avalanche Breakdown Voltage and Controlled Surface Electric Fields Using a Junction Termination Extension (JTE) Technique", *IEEE Transactions on Electron Devices,* vol. ED-30, No. 8, pages 954-957, August 1983), describes use of ion implantation around the main PN junction to control the field distribution and achieve high breakdown voltages. Valdmann describes planar avalanche diode with low breakdown voltage (4-8 volts) using a P-type guard ring around a central PN junction of reduced depth compared to the guard ring in U.S. Pat. No. 4,323,909. Zwernemann describes a high voltage Schottky rectifier employing a diffused guard ring in U.S. Pat. Nos. 3,821,772 and 3,907,617. The above-noted patents are incorporated herein by reference.

Despite the large amount of work that has gone into obtaining PN junctions of improved properties and semiconductor devices with improved reliability and yield, many of the above-described problems remain. Thus, there is an on-going need for improved structures and fabrication techniques which avoid long standing problems associated with prior art semiconductor and manufacturing techniques, especially with junctions intended to function as Zener diodes.

As used herein, the words "Zener diode" (singular or plural) are intended to refer to all kinds of PN junctions exhibiting voltage reference behavior, whether or not the breakdown phenomena is of Zener, avalanche, punch-through or other type. Also, as used herein, the words "scribe" and "scribing" are intended to refer collectively to any or all means for separating a wafer into individual die, regardless of whether that is accomplished by sawing, scribing, breaking, a combination of the foregoing or otherwise. The words "scribe grid" are intended to refer to the region on a semiconductor wafer at the periphery of individual semiconductor die where scribing is intended to be performed. As used herein the words "metal" and "metallization" are intended to refer to metals, semimetals, heavily doped polycrystalline semiconductors or combinations thereof applied to single crystal semiconductors for the purpose making contact thereto.

As used herein, the words "lateral" and "laterally" are intended to refer to directions parallel to the principal surface of the semiconductor wafer or die being discussed and the words "vertical" and "vertically" are intended to refer to directions substantially perpendicular thereto.

The notation (a)E(b) is used to express numbers in scientific notation with the base ten, where (a) is the value and (b) is the power of ten by which the value is multiplied to obtain the number, for example, $5E6 = 5 \times 10^6 = 5,000,000$. This notation is well understood in the art.

SUMMARY OF THE INVENTION

It is an object of the present invention to provide an improved means and method for semiconductor devices. It is a further object to improve the yield and performance of voltage reference devices by making them less susceptible to edge and/or surface defects and/or metallization shorts.

The foregoing and other objects and advantages are realized by a device containing a buried voltage reference junction and, for a first choice of N and P regions, comprising an N-type semiconductor substrate having first and second principal surfaces and an edge extending therebetween, and a P-type region extending to the first surface and having a first portion of a first depth, a second portion of a second depth less than the first depth which laterally surrounds the first portion, and a third portion of a third depth less than the first depth which extends to the edge and laterally surrounds the second portion and which is separated from the second portion by an annular region of the substrate. It is further desirable to have a P+ region in the first portion of the P-type region, extending to the first surface of the substrate. It is important that the metallic contact to the P+ region not extend over the annular region of the substrate. It is further desirable that there be an N+ region in the substrate separated from the P-type region and extending to the second surface of the substrate. N and P may be reversed.

The above described device is desirably fabricate by a process comprising, providing a semiconductor substrate of a first conductivity type, forming in a first surface of the substrate first and second spaced-apart doped regions of a second conductivity type opposite the first type and to a first depth from the first surface, forming a third doped region of the second conductivity type in the second doped region and extending to a second depth greater than the first depth, forming a fourth doped region of the second conductivity type in the second doped region and extending to a third depth less than the first depth, and providing an electrical contact to the fourth doped region which does not extend over any portion of the substrate lying between the first and second doped regions. The third doped region maybe formed before or after the first and/or second doped region.

It is desirable that the steps of forming the third and fourth doped regions comprise forming the third doped region laterally within the second doped region and forming the fourth doped region laterally within the third doped region. It is important to separate individual devices from the substrate along a scribeline lying entirely within the first doped region.

DETAILED DESCRIPTION OF THE FIGURES

The present invention is described in terms of particular N and P regions and particular semiconductor material (i.e., silicon), but this is merely for convenience of explanation and not intended to be limiting. The present invention applies to arrangements in which N and P are reversed or arranged in other combinations. Also, other semiconductor materials beside silicon may be used. Non-limiting examples are germanium, SiC, III-V's, II-VI's and the like. This will be understood by persons of skill in the art based on the description herein.

Figure 1:
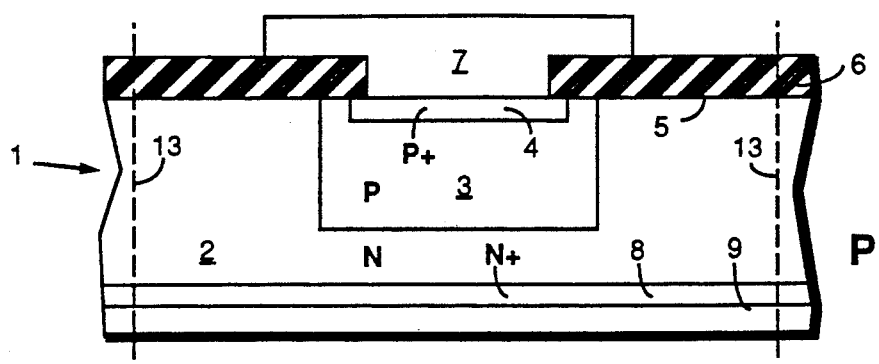
FIG. 1 is a simplified cross-sectional view through a portion of a semiconductor wafer for a Zener diode prepared according to the prior art.
Figure 2:
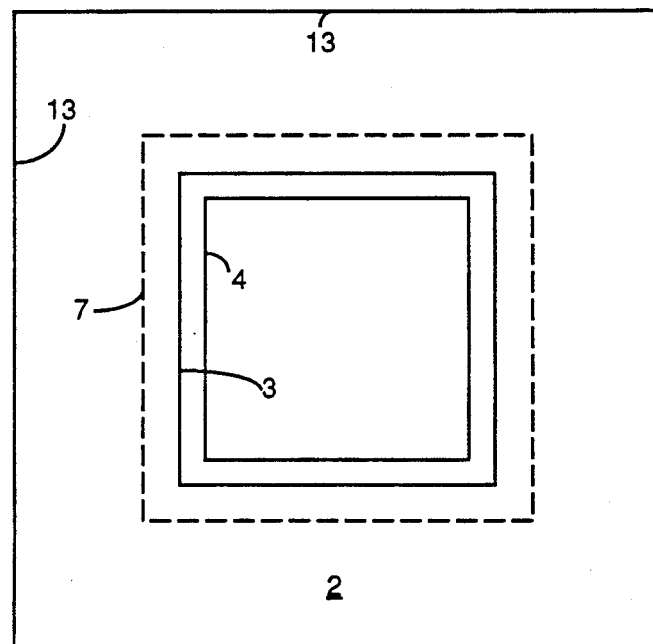
FIG. 2 is a simplified plan view of the device of FIG. 1 after scribing with the location of the periphery of the various doped regions and contact metallization indicated.

FIG. 1 is a simplified cross-sectional view of a Zener diode according to the prior art and FIG. 2 is a plan view of the device of FIG. 1 showing the perimeters of the various doped regions and metallization where they intersect the upper device surface. Portion 1 of N-type substrate 2 has therein P-type doped region 3 containing P+ contact region 4 extending to front surface 5 and N+ region 8 on the rear surface of substrate 2. Silicon dioxide passivation layer 6 is present on front surface 5. Metal region 7 makes contact to P+ region 4 and metal region 9 makes contact to N+ region 8. Substrate 1 is scribed along scribe lines 13 to separate it into individual devices. It will be noted that the perimeter of metallization 7 lies laterally outside the perimeter of P-regions 3 and P+ region 4

Figure 3:
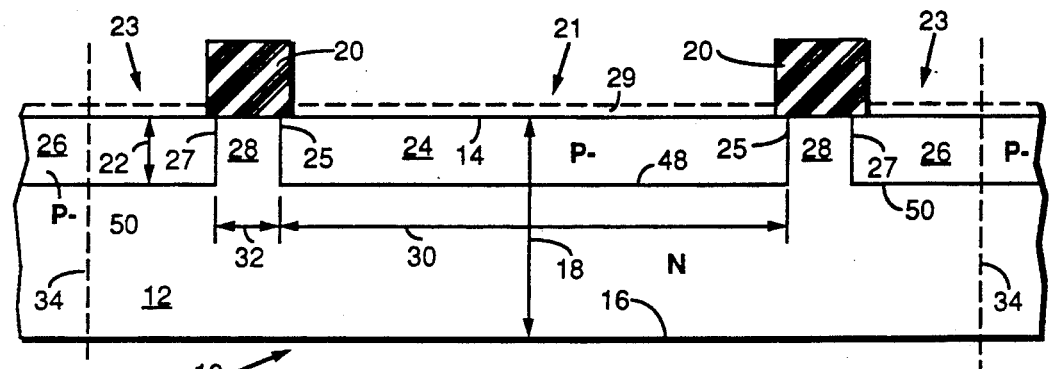
FIGS. 3-6 are simplified cross-sectional views through a portion of a semiconductor wafer according to the present invention at different stages of manufacture of a semiconductor device.

FIGS. 3-6 are simplified cross-sectional views, according to the present invention at different stages of manufacture of portion 10 of semiconductor substrate 12 in which a PN junction 46 is provided in order to form semiconductor device 11, as for example, a Zener diode. FIG. 3 shows substrate 12 of, for example, N-type silicon of predetermined doping concentration (e.g., 5E14–5E18 atoms/cm$^3$, typically 5E15 atoms/cm$^3$) having upper surface 14, lower surface 16 and thickness 18. Thickness 18 should be sufficient to permit the wafer to be handled without undue breakage but otherwise as thin as possible where the primary conduction path is between front face 14 and rear face 16. Thicknesses in the range of about 0.4–1.2 mm or more are useful with about 0.5 mm being preferred. Substrate 12 desirably has substantially uniform doping, but this is not essential. For example, substrates with an epitaxial surface layer may also be used.

Mask 20 is provided on surface 14 so that, after introduction of suitable impurities, P-doped regions 24, 26 of depth 22 are formed in substrate 12. Mask 20 is desirably annular in shape when viewed looking toward surface 14, that is, it forms a closed ring with open regions inside and outside the ring. The lateral topology of mask 20 may be round, oval, square, rectangular or any other closed geometric figure. A square shape is preferred. Depth 22 is typically about 20 micrometers although deeper or shallower regions can be used. P-doped region 24 has perimeter 25 wherein it intersects surface 14 and P-doped region 26 has perimeter 27 where it intersects surface 14. Perimeters 25, 27 are separated by annular N-type region 28 of substrate 12 having width 32. Region 24 has lateral width 30.

Mask 20 is conveniently of dielectric, such as for example, photo resist, silicon oxide, silicon nitride or combinations thereof. Any suitable material may be used provided that it is able to mask the impurities used to create doped regions 24, 26. Silicon dioxide is preferred for mask 20. Mask 20 is typically about 0.5 micrometers thick although thicker or thinner masks many also be used.

Ion implantation through openings 21, 23 in mask 20 followed by an annealing step is the preferred method of obtaining P-doped regions 24, 26 although other doping methods well known in the art can also be used. Typical implant conditions are: energy=80 KeV and dose=5E14 ions/cm$^2$ of B+, with 40–120 KeV and 1E14–1E15 ions/cm$^2$ being useful ranges depending on the desired doping density and implant depth. Typical anneal/drive-in conditions are 1200° C. for about 1–3 hours in $N_2+(2\%)O_2$ followed by 0.5–2 hours in steam followed by 4–5 hours again in $N_2+(2\%)O_2$. Other combinations may also be used, as for example, other ambients and temperatures in the range of 1050°–1250° C. and longer or shorter anneal/drive-in times depending upon the junction depth desired. The intermediate steam cycle facilitates the regrowth of oxide to form the next mask layer but is not essential.

Those of skill in the art understand how to calculate the dose and anneal/drive-in time and temperature based on the particular junction depth and doping profile they wish to obtain. Screen oxide 29 of, for example, about 0.1 micrometers thickness of thermally grown silicon dioxide, is preferably used during ion implantation but is not essential. The above-described implant and anneal provides relatively lightly doped P regions 24, 26 (e.g., P−) in N-type substrate 12.

In a typical device, region 24 has a lateral width 30 of about 2.4 mm although wider or narrower regions can also be used. P-region 24 is separated from P-region 26 by annular N-type substrate region 28 of width 32, typically about 44.5 micrometers. Width 32 is determined by the width of mask 20 in combination with the amount of lateral diffusion of the impurities that create regions 24, 26. Persons of skill in the art understand how to choose the lateral dimensions of mask 20 in order to achieve the desired widths 30, 32 within the semiconductor substrate, depending upon what doping method they elect to utilize. Region 26 extends laterally beyond line 34 which indicates the location of the edge of device 11 after is has been scribed from wafer 12.

Figure 4:
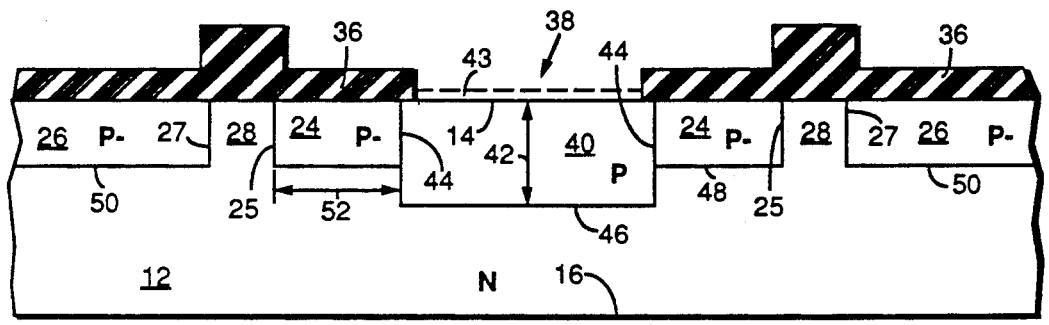

Referring now to FIG. 4, second mask 36 having opening 38 is provided, as for example, by thermal growth of silicon dioxide during the anneal/drive-in step associated with formation of P-region 24, 26. Mask 36 conveniently is about 0.9 micrometers thick over regions 24, 26 and thicker over region 28 since mask 20 is conveniently left in place. While the above-described procedure for forming mask 36 is convenient and preferred, other means well known in the art for forming mask 36 may also be used. Also, mask 36 may be thicker or thinner than the preferred value, so long as it is capable as functioning as a doping mask during formation of P-doped region 40. Mask 36 also conveniently functions as an electrical insulator, but this is not essential. Mask 20 may be left in place during formation of mask 36, and this is preferred, or may be stripped and mask 36 of uniform thickness provided on surface 14, as for example, by oxidation or deposition.

Doped region 40 of depth 42 and perimeter 44 at surface 14 is conveniently provided by ion implantation of boron through opening 38 in mask 36. Typical implant conditions are: dose=1E16 ions/cm$^2$ and energy=80 KeV of B+, with a range of about 1E15–3E16 ions/cm$^2$ and 40–120 KeV being useful. The implant is annealed to drive the dopant into depth 42. The implant is typically annealed at about 1200° C. for 28 hours in $N_2+(2\%)O_2$. Longer and shorter anneal/drive-in times, higher or lower temperatures and other ambients may also be used depending upon the particular device type being fabricated. Those of skill in the art understand how to calculate the dose and anneal/drive-in time and temperature based on the particular junction depth and doping profile they wish to obtain. Screen oxide 43 similar to that previously described may be used during the implant but is not essential.

It is essential that region 40 be deeper than regions 24, 26, that is, that depth 42 exceed depth 22. Also, it is desirable that region 40 have a higher impurity concentration than regions 24, 26. The result of these preferred arrangements is that junction 46 between region 40 and substrate 12 acts as the main current carrying PN junction as compared to auxiliary PN junction 48 between P-region 24 and substrate 12 or auxiliary PN junction 50 between P-region 26 and substrate 12. Perimeter 44 of region 40 and perimeter 25 of region 24 are typically separated by width 52 of about 12.7 micrometers, although larger or smaller values may be used. Width 52 should be large enough to accommodate the metal mask registration error so that outer perimeter 62 of contact metallization 64 falls over P-region 24 and not over N-region 28. This is explained more fully later.

It is important that the breakdown voltage of PN junctions 48, 50 formed between regions 24, 26 and substrate 12 be greater than the breakdown voltage of main PN junction 46 formed between main P-region 40 and substrate 12, preferably greater by twenty-five percent or more. Those of skill in the art will understand, based on the description herein and techniques well known in the art, how to select the relative doping of regions 24, 26 and region 40 (e.g., region 40 more heavily doped than regions 24, 26), taking into account the doping of substrate 12, so that the above-described breakdown voltage difference is achieved.

While it is preferred to form doped regions 24, 26 before doped region 40, this is not essential and doped regions 24, 26, 40 may be formed in any order. Those of skill in the art will understand based on the description herein how to modify the masking sequence depending upon the desired doping sequence.

Figure 5:
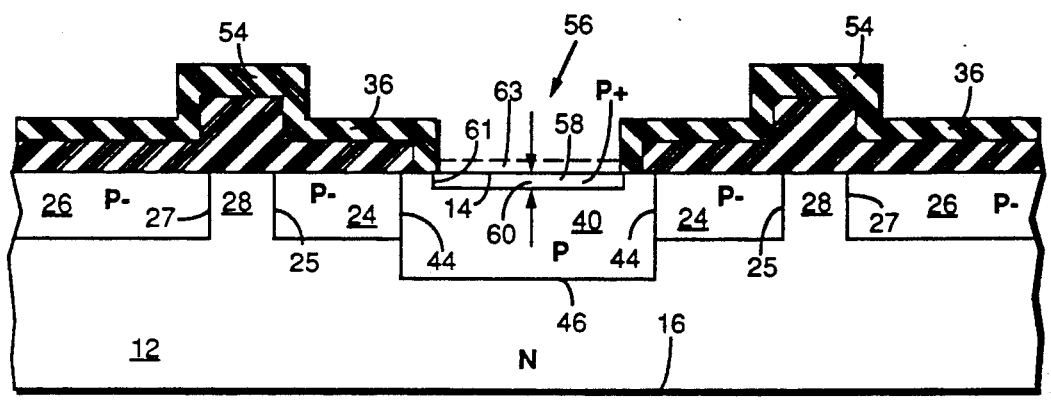

Referring now to FIG. 5, additional dielectric mask layer 54 is provided, conveniently by chemical vapor deposition (CVD) over mask 36. Mask 54 is typically about 0.85 micrometers thick and formed by decomposition of TEOS using means well known in the art. Mask 54 is intended to function as a doping mask during formation of P+ doped region 58 of depth 60 and perimeter 61 at surface 14. Mask 54 also conveniently functions as an electrical insulator. While it is convenient to leave mask 36 in place under mask 54, this is not essential.

Ion implantation is the preferred means for forming doped region 58, but is not essential. Typical boron (B+) implant conditions are: dose=2.5E15 ions/cm$^2$ and energy=40 KeV, with the range of 5E14–1E16 ions/cm$^2$ and energy 10–60 KeV being useful. The implant is typically annealed at about 950° C. for 0.5–1.0 hours, usually about 0.75 hours, in argon, although different ambients, temperatures and times may also be used depending upon the particular type of device being fabricated. Those of skill in the art understand how to calculate the dose and anneal/drive-in time and temperature based on the particular junction depth and doping profile they wish to obtain. Depth 60 is typically about 0.1 micrometers. The function of P+ region 58 is to reduce the contact resistance to P-region 40 and insure ohmic contact thereto by the metallization. Any surface enhancement doping that performs this function is suitable, hence other dopants and other doping means and other drive conditions well known in the art may also be used. Screen oxide 63 similar to that previously described may be used during the implant but is not essential.

Figure 6:
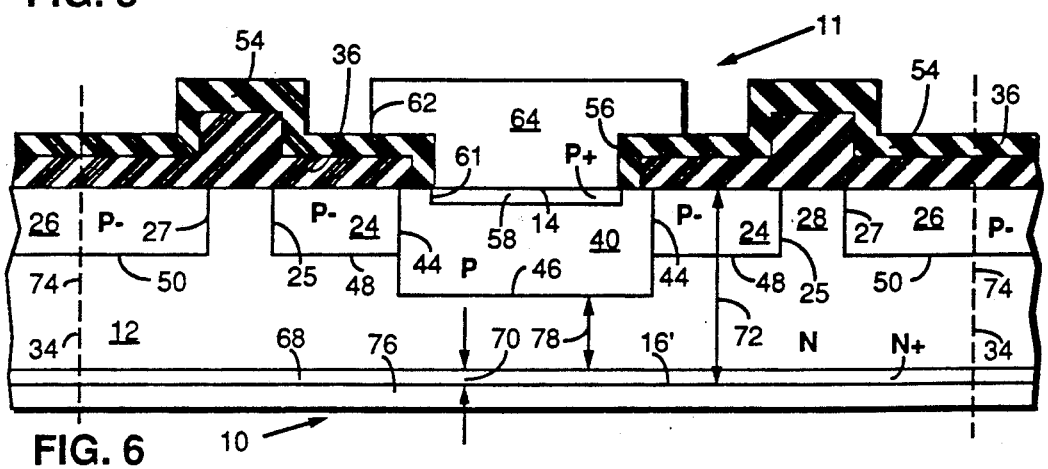

Referring now to FIG. 6, metallization 64 is provided in contact with P-doped region 58 using means well known in the art and delineated using conventional masking techniques so that perimeter 62 lies over P-doped region 24 between perimeters 44 and 24. The important point is that perimeter 62 of metal contact 64 not extend over N-region 28. This is to avoid shorts between P-region contact metallization 64 and N-region 28 which short PN junction 46. Such shorts occur due to photo-mask defects which create pin-holes or weak spots in mask layers 36, 54. By insuring that P-region contact metallization 64 only overlies P-regions, e.g., 58, 40, 24, then even if pin-holes occur, they do not cause shorts. This is an important feature of the present invention.

It is desirable to provide N+ region 68 of depth 70 on rear surface 16' of substrate 12. Rear surface 16' may be the same as original surface 16 of substrate 12 or may be a surface exposed after substrate 12 has been lapped back from surface 16 so that final substrate thickness 72 is less than initial substrate thickness 18. In a finished Zener diode prepared according to the above-described method including back-lapping, width 72 is typically about 0.25 mm and width 78 is typically about 0.22 mm. Larger or smaller thicknesses may be used depending upon the particular device being fabricated.

Depth 70 is typically about 0.05 micrometers, and N+ region 68 is formed using means well known in the art. A shallow, high dose implant followed by annealing is an example of a suitable technique. Laser heating is preferred if backside N+ enhancement region 68 is to be formed after metallization 64 is in place. However, any suitable means for providing doped region 70 may be utilized. The purpose of region 68 is to facilitate ohmic contact to substrate 12 by backside metallization 76.

Metallization 64 and 76 are conveniently of Ti/-Ni/Ag of about 0.1, 0.2 and 0.8 micrometers thickness, respectively, although thicker or thinner layers may be used depending upon the requirements of the particular device being fabricated.

Following metallization, individual devices 11, e.g., Zener diodes, are separated from substrate 12 by scribing along periphery lines 34. It is important that periphery scribe lines 34 pass through P-region 26. This is because, the scribing process frequently causes microcracks in resulting die edge 74 (see FIG. 7). Such microcracks can perturb the electrical properties for a considerable distance laterally into substrate 12. If such perturbations reach junction 46, then the electrical properties of the junction 48 can be degraded.

These micro-cracks are most often formed on periphery 34 near surface 14. Peripheral P-region 26 provides electrical isolation between periphery 34 at surface 14 and junction 46, 50 and therefore inhibits the deleterious action of such microcracks. Manufacturing yields and reliability are thereby improved.

Spacing 32 between perimeter 25 of P-region 24 and inner perimeter 27 of P-region 26 should be larger than the depletion region associated with avalanche or breakdown of PN junction 48, 50. This is especially important where device 11 is a Zener diode. Width 32 should be larger than the depletion width plus any alignment tolerance needed to insure that metal 64 does not overlie region 28, plus a reasonable safety margin. However, it is generally not desirable to have width 32 substantially wider than what is needed to satisfy this criteria, since the greater width 32, the greater the substrate area in region 28 which is vulnerable to spurious contacts or surface defects arising, for example, from oxide pinholes in dielectrics 20, 36, 54 or photo-mask defects which overlie region 28 during manufacturing or excess metallization or solder flowing onto the die during assembly or other causes. Thus, width 32 is preferably chosen to insure that there is no breakdown between regions 24, 26 at the highest operating voltage for which the device is being designed, plus any required alignment tolerance, plus a reasonable safety margin, without excess.

Figure 7:
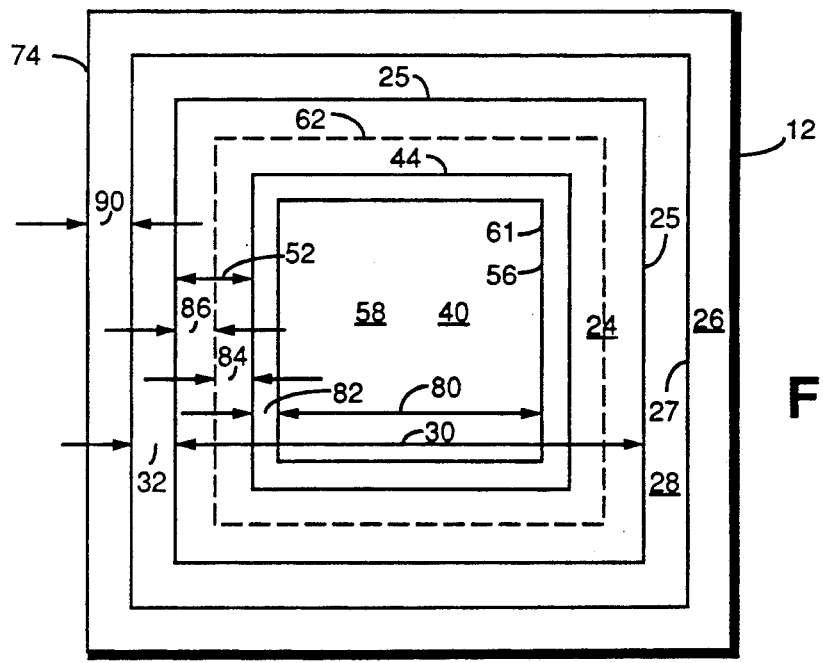
FIG. 7 is a simplified plan view of the device of FIG. 6 after scribing with the location of the periphery of the various doped regions and contact metallization indicated.

Widths in the range of 40–50 micrometers, typically about 44–45 microns, are useful for devices having breakdown voltages in the range up to few hundred volts. This is preferred for Zener diodes having Zener voltages in the range 4.5–300 volts and more particularly in the range 4.5–180 volts FIG. 7 shows a plan view of device 11 in which peripheries 25, 27, 44, 61, 62 of the various regions are visible. The peripheries of the doped regions 24, 26, 28, 40 and 58 are shown as solid lines and periphery 62 of metallization 64 is shown dashed. The difference between mask opening 56 and periphery 61 of P+ region 58 is so small that the two boundaries lie on top of each other in FIG. 7.

Typical device dimensions are: central P+ contact region width 80 equals 2.3 mm, lateral separation 82 between contact region 58 and perimeter 44 of P-region 40 equals about fifty micrometers, lateral separation 84 between P-region perimeter 44 and metal contact perimeter 62 equals about three micrometers, lateral separation 86 between metal perimeter 62 and P-region perimeter 25 equals about ten micrometers, lateral separation 32 between P-regions perimeters 25 and 27 (the width of annular N-region 28) equals about forty-five micrometers, and lateral separation 90 between inner perimeter 25 of P-region 26 bordering N-region 28 and die edge 74 equals about fifty-seven micrometers.

While the lateral dimensions and depths of the various device regions described above may be made larger or smaller as suits the needs of the particular device being constructed, it is important that the breakdown voltages of regions 24, 26 to substrate 12 be larger than the breakdown voltage of region 40 to substrate 12. This may be accomplished by making depth 42 of central region 40 exceed depth 22 of peripheral regions 24, 26 and having depth 60 of heavily doped region contact region 58 be less than depth 22 and by having region 40 more heavily doped than regions 24, 26. Regions 24, 26 may have the same depth, as shown for example in FIGS. 3–6 or may have different depths, so long as their depths are shallower than depth 42. Regions 24, 26 are desirably spaced apart by distance 32 which equals or exceeds the maximum device depletion region width.

Metallization periphery 62 should not extend over N-region 28, but lie entirely over a P-region, as for example, P-regions 40, 24. Further, peripheral P-region 26 should extend to and intersect the edge of the wafer after scribing. In addition depths 22 and 42 should be large enough so that junctions 48, 50 and 46 are far enough from surface 14 so as to not be affected by any surface defects therein. The greater the amount of surface damage, the deeper the junctions must be. This has important cost savings implications, since less expensive starting materials generally have a greater amount of and deeper surface damage. By placing the important junctions well below the damage depth, less expensive starting materials can be used.

While the depths given herein are suitable for many devices, as for example Zener diodes, other depths may be used depending on the density and depth of surface related defects. Those of skill in the art will understand, based on the description herein, how the dimensions of the various doped regions, device active area and outer dimensions may be varied, depending upon the particular electronic function desired, to remain consistent with the above-described guidelines.

Devices fabricated according to the above-described guidelines have improved yield and performance. The prior art devices to which they are compared are industry standard Zener diodes manufactured in very high quantity (tens of millions per year). Their cross-section is illustrated in FIG. 1. They have a shallow P-region adjacent to and contacting the deep central P-region, but its periphery lies within the exterior periphery of the the P contact metallization. The prior art devices lack the features of the present invention of the shallow peripheral P-region extending to the die edge and have metallization that extends above the N-type substrate laterally outside the central active P-region.

Identical tests were conducted on Zener diodes having nominal $V_z$ values of 36 and 180 volts, prepared according to the prior art and according to the present invention. The test devices of the prior art and the present invention had the same active junction area, that is, the active PN junction area of regions 3 (see FIG. 1) and 40 (see FIG. 5) were substantially the same. The percentage of Zener diodes showing shorts or high leakage under reverse bias dropped from 1.5–2% for the prior art devices to 0.2–0.9% with the present invention. In addition, typical reverse leakage currents of good devices dropped from about 24 to 2.5 nanoamps for the 36 volt devices and from about 98 to 6.7 nanoamps for the 180 volt devices. Prior art 36 volt structures had surge capabilities of typically 2332 watts (std. dev. 123 watts) versus 2345 watts (std. dev. 86 watts) for devices prepared according to the present invention and prior art 180 volt devices has surge capabilities of typically 1806 watts (std. dev. 290 watts) versus 2187 watts (std. dev. 174 watts) for devices prepared according to the present invention. Not only did the invented devices have equal or better surge capabilities, but the manufacturing variance (standard deviation) was substantially reduced.

Zener diodes have been known and made by the hundreds of millions each year for many years, yet the problems described herein have not previously been overcome, despite the work of many persons of skill in the art. The improvements illustrated above in a mature product such as Zener diodes are very significant.

While the present invention has been described in terms of certain illustrative structures and materials, those of skill in the art will understand that many variations are possible without departing from the present invention. For example, other semiconductor materials may be used, P may be substituted for N and vice-versa, additional doped regions may be added, as for example to make thyristors or transistors or other semiconductor devices, and other materials may be used for the various masks and insulating dielectrics and electrical contacts. It is intended to include in the claims that follow, these and such other variations as will occur to those of skill in the art based on the teachings herein.

I claim:

1. A process for forming a Zener diode having a Zener junction removed from the diode surface, comprising:

providing a semiconductor substrate of a first conductivity type;

forming in a first surface of the substrate first and second spaced-apart doped regions of a second conductivity type opposite the first type and to a first depth from the first surface;

forming a third doped region of the second conductivity type in the second doped region and extending to a second depth greater than the first depth;

forming a fourth doped region of the second conductivity type in the second doped region and extending to a third depth less than the first depth; and providing an electrical contact to the fourth doped region which does not extend over any portion of the substrate lying between the first and second doped regions, wherein the steps of forming the third and fourth doped regions comprises forming the third doped region laterally within the second doped region and forming the fourth doped region laterally within the third doped region.

2. The process of claim 1 further comprising separating an individual Zener diode from the substrate along a perimeter lying entirely within the first doped region.

3. The process of claim 1 wherein the first and second forming steps are performed in opposite order.

4. A process for forming a semiconductor device, comprising:

providing a semiconductor substrate of a first conductivity type, having a first principle surface;

and then in either order, (i) forming in the substrate a first doped region of a second conductivity type opposite the first conductivity type and extending to a first depth from the first surface, wherein the first doped region has first and second portions, the second portion laterally surrounding the first portion at the first surface and spaced apart therefrom by a first distance so that an annular portion of the substrate extends to the first surface therebetween, and (ii) forming in the substrate a second doped region of the second conductivity type extending to a second depth from the first surface exceeding the first depth and lying laterally within the first portion of the first region at the first surface;

forming a first electrical contact to the second doped region wherein the first contact extends laterally over the first portion of the first region but not over the annular portion of the substrate between the first and second portions of the first region; and separating a portion of the substrate containing the electrical contact so that the second portion of the first doped region is exposed on an edge of the separated portion extending between the first surface and a second surface opposite the first surface.

5. A process for forming a semiconductor device, comprising:

providing a semiconductor substrate of a first conductivity type, having a first principle surface;

and then in either order, (i) forming in the substrate a first doped region of a second conductivity type opposite the first conductivity type and extending to a first depth from the first surface, wherein the first doped region has first and second portions, the second portion laterally surrounding the first portion at the first surface and spaced apart therefrom by a first distance so that an annular portion of the substrate extends to the first surface therebetween, and (ii) forming in the substrate a second doped region of the second conductivity type extending to a second depth from the first surface exceeding the first depth and lying laterally within the first portion of the first region at the first surface;

forming a first electrical contact to the second doped region wherein the first contact extends laterally over the first portion of the first region but not over the annular portion of the substrate between the first and second portions of the first region;

separating a portion of the substrate containing the electrical contact so that the second portion of the first doped region is exposed on an edge of the separated portion extending between the first surface and a second surface opposite the first surface; and providing in the second doped region and extending to the first surface a further doped region of the second conductivity type but more heavily doped than the second doped region.

6. The process of claim 5 further comprising, providing in the second surface a further doped region of the first conductivity type but more heavily doped than the substrate.

7. The process of claim 6 wherein the step of providing the further doped region is performed prior to the separating step.

8. The process of claim 6 further comprising thinning the wafer prior to providing the further doped region.

9. The process of claim 5 further comprising prior to the separating step, providing a dielectric extending over the annular region of the substrate on the first surface.

10. The process of claim 5 wherein the first providing step comprises, providing an annular first dielectric mask on the first surface corresponding to the desired location of the annular portion of the substrate between the first and second portions of the first doped region, and thereafter providing the first doped region by doping the substrate on either side of the first mask.

11. The process of claim 10 further comprising forming a second dielectric mask having an opening over the first portion of the first doped region and thereafter forming the second doped region through that opening.

12. The process of claim 11 further comprising forming a third dielectric mask with an opening lying laterally within the opening of the second dielectric mask and thereafter forming in the second doped region through the third opening, a third doped region of the second conductivity type and more heavily doped than the second doped region.

* * * * *